United States Patent [19]

Dumbser

[11] Patent Number: 4,731,306

[45] Date of Patent: Mar. 15, 1988

[54] BATTERY ARRANGEMENT

[75] Inventor: Gerhard Dumbser, Niederwerrn, Fed. Rep. of Germany

[73] Assignee: Sachs-Huret SA, France

[21] Appl. No.: 942,540

[22] Filed: Dec. 16, 1986

[30] Foreign Application Priority Data

Dec. 17, 1985 [DE] Fed. Rep. of Germany ... 8535374[U]

[51] Int. Cl.⁴ .............................................. H01M 2/10
[52] U.S. Cl. .......................................... 429/98; 429/1; 429/96; 429/99; 429/100
[58] Field of Search ............................... 429/1, 96–100

[56] References Cited

U.S. PATENT DOCUMENTS 2,523,354  9/1950  Butler ..................................... 429/98

Primary Examiner—Aaron Weisstuch
Attorney, Agent, or Firm—Toren, McGeady & Associates

[57] ABSTRACT

A battery arrangement is used with a distance and speed measuring indicator for cycles. Two batteries can be accommodated and electrically connected in a battery chamber, so that in battery replacement the old battery can remain in the battery chamber and in electric connection with its contact terminals until the new battery is inserted into the battery chamber and is in electric connection with the contact terminals. In this way; during battery replacement, the loss of the data stored in the memory of the appliance is prevented.

12 Claims, 6 Drawing Figures

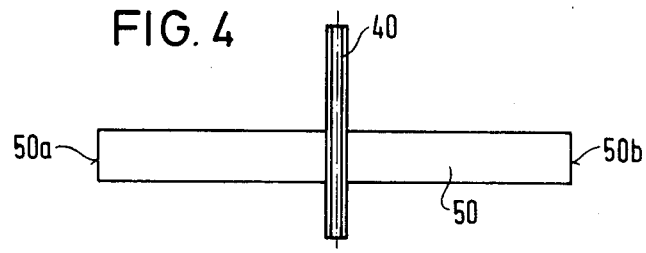
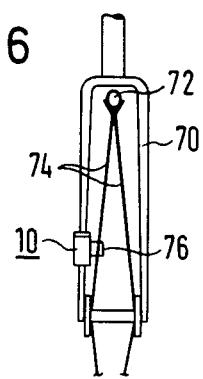
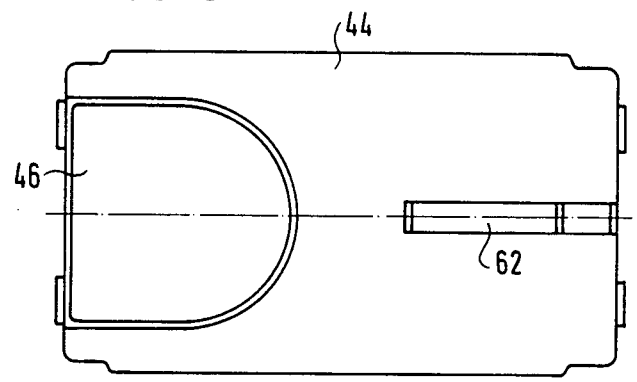

BATTERY ARRANGEMENT

BACKGROUND OF THE INVENTION

In battery-operated electronic appliances with memory it is necessary from time to time to replace the power supply battery, frequently in the form of a button-shaped cell, by a fresh cell with full power. In such battery replacement, however, it is necessary that the electronic memory is constantly connected to voltage, because on a failure of voltage the memory contents, for example, storage of total travelled distance, can be lost.

STATEMENT OF THE PRIOR ART

The possibility exists of applying an external voltage source to such a battery-operated apparatus with memory during battery replacement to maintain the memory contents. This, however, is relatively undesirable because a suitable voltage source is not always available.

On the other hand, the possibility also exists of providing an energy storage means, such as a capacitor, whereby voltage failure in replacing the battery can be bridged over. In that case, however, only a limited short period of a few seconds is available for the battery change.

PROBLEM OF THE INVENTION

The invention is based on the problem, in a battery-operated electronic appliance with memory storage, of ensuring that a battery change can be effected without danger of loss of memory content and without use of an external voltage source, while still providing an adequate time period for convenient replacement of the batteries.

OBJECT OF THE INVENTION

A battery arrangement for an electronic appliance equipped with memory storage is proposed where a battery chamber with electric contact terminals is provided to accommodate the battery.

To solve the problem mentioned above it is proposed that the battery chamber be equipped for the simultaneous accommodation and electric connection of at least two batteries in such a way that in battery replacement the old battery can remain in the battery chamber and in electric connection with the contact terminal strips until the new battery is inserted into the battery chamber and is in electric connection with the contact terminal strips.

With the battery arrangement according to the invention it is easily possible for every user, even for a technically ungifted user, to carry out the battery change without any hurry, and without danger of loss of the memory contents. The solution according to the invention requires no external voltage source and does not involve any substantial extra expense or substantially increased space requirement.

In another aspect of the invention, blocking means can be provided which prevent the simultaneous presence of two batteries in the battery chamber in operating condition. In this way it is ensured that the old battery in each case is removed before operation starts afresh. Accordingly, it is ensured that in subsequent repeated battery changes only one old battery is present in the chamber and, therefore the most used battery is removed in each case.

Further features of the invention appear from the appended claims which constitute a part of the disclosure.

BRIEF DESCRIPTION OF THE DRAWINGS

The accompanying drawings explain the invention by reference to an example of an embodiment of the invention:

FIG. 4 is a detailed illustration of a separating element;

FIG. 5 is a detailed illustration of a lid; and

FIG. 6 is the arrangement of an appliance according to the invention on a cycle.

DESCRIPTION OF THE PREFERRED FORM OF EMBODIMENT

Figure 1:
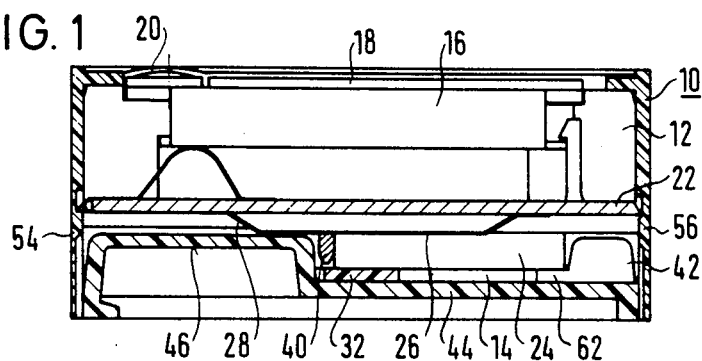
FIG. 1 is a section through an electronic appliance with a battery arrangement according to the invention.
Figure 2:
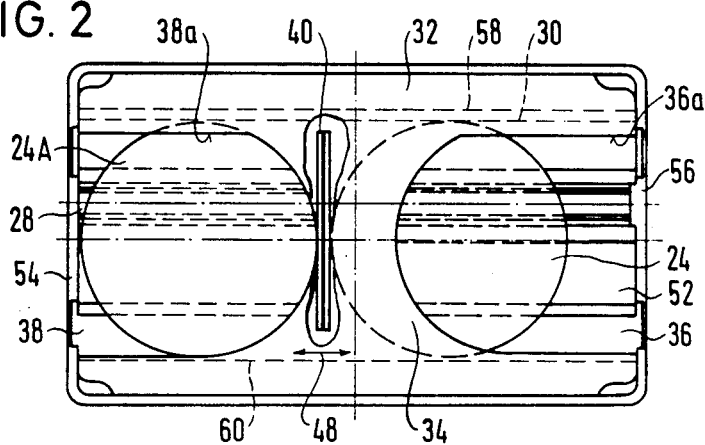
FIG. 2 is a view of the appliance according to the invention in a first phase of battery replacement.
Figure 3:
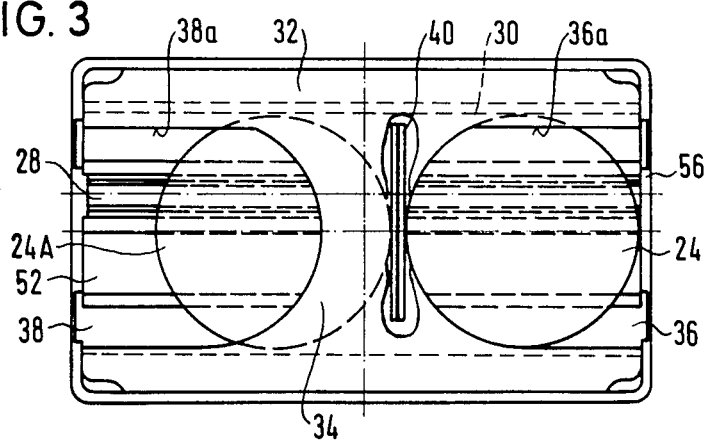
FIG. 3 is a bottom view of the appliance according to the invention in a second phase of battery replacement.

In FIG. 1 a housing is designated generally by 10. This housing comprises a first chamber 12 and a second chamber 14. The first chamber 12 accommodates the electronic equipment. This electronic equipment includes a computer or micro-processor 16 and display device 18, for example a liquid crystal display device. The electronic equipment further includes an operating knob 20. The second chamber 14 is separated from the first chamber 12 by a floor 22. The second chamber 14 is a battery chamber which accommodates a button-shaped cell 24 in the operating condition. The button-shaped cell 24 carries on its end face 26 a first pole which is in electrically conductive contact with a contact terminal strip 28. The contact terminal strip 28 is secured to the floor 22 of the housing. The housing circumference of the button-shaped cell 24 forms a second pole. This second pole is in electrically conductive contact with a second contact terminal strip 30, which is shown in FIGS. 2 and 3. The contact terminal strips 28 and 30 are in electrically conductive connection with the micro-processor 16. In this way the electric current supply to the micro-processor 16 is guaranteed. The button-shaped cell 24 is held by a retaining plate 32 which comprises a middle flange 34 and two button-shaped cell insertion openings 36 and 38, as appears especially from FIGS. 2 and 3. The edges of the button-shaped cell insertion openings 36 and 38 overlap the second contact terminal strip 30, note FIGS. 2 and 3. In FIG. 1 the button-shaped cell 24 is situated in the operating position. It is held in the horizontal direction by a separating element 40 and by a dog 42 provided on a releasable snap-on lid 44. The snap-on lid 44 has a depression 46 which serves as blocking body and fills out a part of the battery chamber 14. The separating element 40 is displaceable in the direction of the arrow 48 in FIG. 2 and for this purpose—as may be seen from FIG. 4—is united with a slide strip 50 which is guided displaceably in a guide groove 52 of the floor 22. In FIGS. 1 and 2 the slide strip 50 is situated in its left end position in which its end 50a rests on the end wall 54, while the right end 50b is spaced from the end wall 56 of the chamber 14. Therefore when the snap-on lid 44 is inserted the button-shaped cell 24 is secured by the separating element 40 and by the dog 42 against displacement in the direction of the arrow 48. At the same time the button-shaped cell 24 lies against a side wall 58 which carries the contact terminal strip 30, and against a side wall 60. The contact of the end face of the button-shaped cell with the contact terminal strip 28 is secured by a projection 62 of the snap-on lid 44 (note FIG. 5).

For the replacement of the button-shaped cell 24 the snap-on lid 44 is removed. This condition is represented in FIG. 2. A second button-shaped cell 24A can now be inserted into the space which the blocking element 46 previously occupied. The insertion of the button-shaped cell 24A takes place through the button-shaped cell insertion opening 38. In this operation the button-shaped cell 24A must firstly be pushed, in a position inclined in relation to the plane of the floor 22, in beneath the edge 38a of the button-shaped cell insertion opening 38 which overlaps the second contact terminal strip 30. Then the button-shaped cell 24A can be pivoted into a position parallel with the floor 22. When this pivoting has taken place the button-shaped cell 24A—like the button-shaped cell 24—is in conductive contact with the contact terminal strips 28 and 30. This signifies that the two button-shaped cells 24 and 24A are galvanically connected in parallel with one another. Now the button-shaped cell 24A is shifted to the right in the direction of the arrow 48. In this movement the button-shaped cells 24A and 24 come into the position shown in FIG. 3. Then the button-shaped cell 24 is situated substantially in coincidence with the button-shaped cell insertion opening 36, while the button-shaped cell 24A engages beneath the flange 34 of the retaining plate 32 (see FIG. 3). The separating element 40 in this pushing movement is shifted to the right with and between the two button-shaped cells 24 and 24A until the end 50b of the slide strip 50 rests on the end wall 56. Now the new button-shaped cell 24A is situated in its operating position and the old button-shaped cell 24 can be removed through the button-shaped cell insertion opening 36. The removal can take place when the housing is turned through 180° from the position shown in FIG. 1. Then the button-shaped cell 24 falls out of the battery chamber 14 through the button-shaped cell insertion opening 36, first carrying out a pivoting movement about the protruding edge 36a. Now the snap-on lid 44 can be fitted again, namely in a position turned through 180° in comparison with FIG. 1 in the plane of the snap-on lid 44. The blocking body 46 then assumes that position previously occupied by the button-shaped cell 24. The presence of the blocking body 46 ensures that the old button-shaped cell 24 must be removed before the snap-on lid 44 can be replaced. In this way it is ensured that the old button-shaped cell 24 must always be removed before the replacement the snap-on lid 44. If it were not to be removed the danger would exist that the old cell would discharge the new one.

After replacement of the snap-on lid 44 the new button-shaped cell 24A is again secured, namely by the separating element 40 and the dog 42.

The protruding edges 36a and 38a prevent the button-shaped cells from being introduced in an orientation in which they could conductively bridge over the two contact terminal strips 30 and 28. Likewise the insulating separating element 40 prevents the button-shaped cell which is to be newly inserted or is just being removed from conductively connecting the two poles of the respective other button-shaped cell with one another. In this way danger of short-circuiting is avoided. It must be avoided since a short-circuit could lead to clearing of the data memory which is a part of the micro-processor 16.

It should be understood from the foregoing that at every moment in the exchanging of the button-shaped cells at least one button-shaped cell is connected to the two contact terminal strips 30 and 28, in each case by the correct pole, so that the current supply for the micro-computer is never interrupted.

As may be seen from FIG. 6, the housing 10 is arranged for detachable fitting on one leg of a front fork 70 of a cycle. The front wheel is indicated by 72. Its spokes are indicated by 74. Magnet 76 is seated on one spoke which runs periodically past the housing 10. The housing contains a sensor (not illustrated) which is influenced by the magnet 76 and delivers a pulse to the micro-processor 16 every time the magnet 76 passes. These pulses are counted and may be stored in the micro-processor. They serve for the production of a display of a travelled distance and/or the speed of the cycle at the time.

The retaining wall 32 is produced in one piece with the floor 22, and the side walls 58 and 60 can likewise be integrally connected with the retaining wall 32 and the floor 22. Preferably, all parts of the housing 10 and the chamber 14 consist of insulating synthetic plastics material.

It is also to be remarked that the button-shaped cells can be guided with stiff motion by the contact terminal strips 28 and 30, so that uncontrolled movement of the button-shaped cells cannot take place even in cell replacement.

The snap-on lid can be produced in one piece with spring elements (not shown) of synthetic plastics material which co-operate with corresponding recesses of the housing 10.

The housing 10 can be made with connection parts which co-operate with complementary connection parts of a housing carrier fitted on the fork 70, so that the correct position of the housing 10 in relation to the magnet 76 can be repeatedly obtained. The magnet 76 is a permanent magnet.

Modifications of the example of embodiment are possible. The numerical references in the claims serve merely for facilitation of understanding and are not limitative.

I claim:

1. A battery arrangement for an electronic appliance equipped with a data memory (16), comprising a battery accommodation chamber (14) with electric contact terminal strips, (28, 30) wherein the improvement comprises that the battery chamber (14) is equipped for the simultaneous accommodation and electric connection of at least two batteries (24, 24A) so that in battery replacement the old battery (24) can remain in the battery chamber (14) and in electrical connection with the contact terminal strips (28, 30) until the new battery (24A) is inserted into the chamber (14) and is in electrical connection with the contact terminal strips (28, 30).

2. The battery arrangement according to claim 1, wherein blocking means (46) prevent the simultaneous presence of two batteries (24, 24A) in the battery chamber (14) in the condition ready for operation.

3. The battery arrangement according to claim 2, wherein the battery chamber (14) comprises a lid (44) with a blocking body (46), and when the lid (44) is closed this blocking body (46) occupies at least a part of the space required for the new battery, in such a way that after a battery replacement the old battery (24) in each case must be removed before the lid (44) can be brought into the closure position.

4. The battery arrangement according to claim 1, wherein the battery chamber (14) comprises insulating contact protection means (40, 36a, 38a) which prevent a short-circuit.

5. The battery arrangement according to claim 1, wherein the battery chamber (14) is formed for the reception of button-shaped cells (24, 24A).

6. The battery arrangement according to claim 5, wherein the battery chamber (14) comprises a floor (22) with a first contact terminal strip (28) and a side wall (58) with a second contact terminal strip (30) and the two contact terminal strips (28, 30) are formed continuously for the electrical connection of the two button-shaped cells (24, 24A).

7. The battery arrangement according to claim 6, wherein a sliding guide (22, 32, 58, 60) for two button-shaped cells (24, 24A) is formed in the battery chamber (14), in that this sliding guide (22, 32, 58, 60) comprises two button-shaped cell insertion positions (36, 38) spaced from one another and in that the pair of button-shaped cells (24, 24A) is pushable to and fro in the sliding guide (22, 32, 58, 60) in tandem manner over a sliding distance between two end positions determined by end stops (54, 56), where in the one end position of the button-shaped cell pair (24, 24A), the one button-shaped cell (24A) is in alignment with the one button-shaped cell insertion position (38) and in the other end position of the button-shaped cell pair (24, 24A) the other button-shaped cell (24) is in alignment with the other button-shaped cell insertion position (36).

8. The battery arrangement according to claim 7, wherein an electrically insulating separating element (40) is provided in the battery chamber (14) between the two button-shaped cells (24, 24A) and is displaceable with the button-shaped cell pair (24, 24A) in each case along the sliding guide (22, 32, 58, 60).

9. The battery arrangement according to claim 8, wherein the separating element (40) is only limitedly displaceable along a path corresponding to the sliding path of the button-shaped cell pair (24, 24A) in the sliding guide (22, 32, 58, 60), so that after the removal of the old button-shaped cell (24) in each case the separating element (40) constitutes a first slide limiting stop for the new button-shaped cell (24A).

10. The battery arrangement according to claim 9, wherein a second slide limiting stop (42) for the new button-shaped cell (24A) in each case is fitted on a lid (44) of the battery chamber (14).

11. The battery arrangement according to claim 7, wherein the button-shaped cell insertion positions (36, 38) are formed so that they prevent positioning of the button-shaped cells (24, 24A) in which they metallically bridge over the first and second contact terminal strips (28, 30).

12. The battery arrangement according to claim 11, wherein the sliding guide (22, 32, 58, 60) is limited by a retaining wall (32) substantially parallel to the floor (22) with button-shaped cell insertion openings (36, 38), edges (36a, 38a) of which openings grasp over second contact terminal strip (30).

* * * * *